(12) United States Patent
Matsumoto et al.

(10) Patent No.: US 10,777,704 B2
(45) Date of Patent: Sep. 15, 2020

(54) MANUFACTURING METHOD FOR GROUP III NITRIDE SEMICONDUCTOR SUBSTRATE AND GROUP III NITRIDE SEMICONDUCTOR SUBSTRATE

(71) Applicant: SUMCO CORPORATION, Tokyo (JP)

(72) Inventors: Koji Matsumoto, Tokyo (JP); Toshiaki Ono, Tokyo (JP); Hiroshi Amano, Aichi (JP); Yoshio Honda, Aichi (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 15/773,391

(22) PCT Filed: Nov. 1, 2016

(86) PCT No.: PCT/JP2016/082485
§ 371 (c)(1),
(2) Date: May 3, 2018

(87) PCT Pub. No.: WO2017/082126
PCT Pub. Date: May 18, 2017

(65) Prior Publication Data
US 2018/0337306 A1  Nov. 22, 2018

(30) Foreign Application Priority Data

Nov. 12, 2015 (JP) .................. 2015-222503

(51) Int. Cl.
*H01L 33/12* (2010.01)
*C23C 16/34* (2006.01)
*H01L 33/32* (2010.01)
*H01L 21/02* (2006.01)
*C30B 29/38* (2006.01)
*H01L 21/302* (2006.01)
(Continued)

(52) U.S. Cl.
CPC .............. *H01L 33/12* (2013.01); *C23C 16/34* (2013.01); *C30B 25/02* (2013.01); *C30B 29/38* (2013.01);
(Continued)

(58) Field of Classification Search
CPC .......... H01L 21/02458; H01L 21/0254; H01L 21/02639; H01L 21/02647; H01L 21/0262
See application file for complete search history.

(56) References Cited

U.S. PATENT DOCUMENTS 6,240,115 B1 * 5/2001 Chen ................. H01S 5/32341
372/45.01
6,447,604 B1 * 9/2002 Flynn ..................... C30B 25/00
117/89
(Continued)

FOREIGN PATENT DOCUMENTS

CN       103614769 A      3/2014
JP       2000-331946 A    11/2000
(Continued)

OTHER PUBLICATIONS

ISR from PCT/JP2016/082485, dated Feb. 7, 2017.
IPRP from PCT/JP2016/082485, dated May 15, 2018.

*Primary Examiner* — Ermias T Woldegeorgis
(74) *Attorney, Agent, or Firm* — Greenblum & Bernstein, P.L.C.

(57) ABSTRACT

A manufacturing method for a group III nitride semiconductor substrate is provided with a first step of forming a second group III nitride semiconductor layer on a substrate; a second step of forming a protective layer on the second group III nitride semiconductor layer; a third step of selectively forming pits on dislocation portions of the second group III nitride semiconductor layer by gas-phase etching applied to the protective layer and the second group III nitride semiconductor layer; and a fourth step of forming a third group III nitride semiconductor layer on the second group III nitride semiconductor layer and/or the remaining protective layer so as to allow the pits to remain.

29 Claims, 6 Drawing Sheets

(51) Int. Cl.
    *H01L 33/22*     (2010.01)
    *C30B 25/02*     (2006.01)
    *C30B 29/40*     (2006.01)
    *H01L 29/20*     (2006.01)
    *H01L 29/34*     (2006.01)
    *H01L 33/00*     (2010.01)
    *H01L 33/02*     (2010.01)

(52) U.S. Cl.
    CPC ........ *C30B 29/406* (2013.01); *H01L 21/0254* (2013.01); *H01L 21/0262* (2013.01); *H01L 21/02381* (2013.01); *H01L 21/02458* (2013.01); *H01L 21/02505* (2013.01); *H01L 21/02639* (2013.01); *H01L 21/02645* (2013.01); *H01L 21/02647* (2013.01); *H01L 21/302* (2013.01); *H01L 29/2003* (2013.01); *H01L 29/34* (2013.01); *H01L 33/007* (2013.01); *H01L 33/025* (2013.01); *H01L 33/22* (2013.01); *H01L 33/32* (2013.01); *H01L 21/02488* (2013.01); *H01L 21/02513* (2013.01)

(56) References Cited

U.S. PATENT DOCUMENTS

| | | | | |
|---|---|---|---|---|
| 2004/0067648 | A1* | 4/2004 | Morita | C30B 25/02 438/689 |
| 2005/0139960 | A1* | 6/2005 | Shibata | C30B 25/02 257/615 |
| 2007/0125996 | A1 | 6/2007 | Morita et al. | |
| 2008/0050599 | A1 | 2/2008 | Morita et al. | |
| 2010/0124814 | A1* | 5/2010 | Arena | H01L 21/02458 438/504 |
| 2011/0212603 | A1 | 9/2011 | Arena et al. | |
| 2012/0280249 | A1 | 11/2012 | Arena | |
| 2014/0235037 | A1 | 8/2014 | Morita et al. | |

FOREIGN PATENT DOCUMENTS

| | | | |
|---|---|---|---|
| JP | 2002-043233 | A | 2/2002 |
| JP | 2002-217115 | A | 8/2002 |
| JP | 2002-261027 | A | 9/2002 |
| JP | 2002-367909 | A | 12/2002 |
| JP | 2002367909 | A * | 12/2002 |
| JP | 2004-502298 | A | 1/2004 |
| JP | 2006-225180 | A | 8/2006 |
| JP | 2006225180 | A * | 8/2006 |
| JP | 2007-008742 | A | 1/2007 |
| JP | 2007008742 | A * | 1/2007 |
| JP | 2007-184503 | A | 7/2007 |
| JP | 2009-120484 | A | 6/2009 |
| JP | 2012-508686 | A | 4/2012 |
| JP | 2015-151330 | A | 8/2015 |
| JP | 2015151330 | A * | 8/2015 |

* cited by examiner

MANUFACTURING METHOD FOR GROUP III NITRIDE SEMICONDUCTOR SUBSTRATE AND GROUP III NITRIDE SEMICONDUCTOR SUBSTRATE

TECHNICAL FIELD

The present invention relates to a manufacturing method for a group III nitride semiconductor substrate and a group III nitride semiconductor substrate.

BACKGROUND ART

Usually, in a process of manufacturing a group III nitride semiconductor substrate by growing a group III nitride semiconductor layer on a substrate, many dislocations occur in the group III nitride semiconductor layer due to lattice mismatch between a substrate material and a group III nitride semiconductor material. When a GaN film is formed on an Si substrate, the dislocation density on the surface of a GaN layer is $1\times10^9$ cm$^2$ to $1\times10^{10}$ cm$^2$, and even when a sapphire substrate commonly used in recent years is used as a substrate, the dislocation density on the GaN layer surface is about $5\times10^8$ cm$^2$. The dislocation may cause a reduction in luminance efficiency when the group III nitride semiconductor substrate is used for an LED and may cause a leak current when used for a power device.

Patent Document 1 describes a manufacturing method for a GaN-based compound semiconductor. The method includes forming a first GaN-based compound semiconductor layer on a substrate, forming discretely an SiN buffer body on the first GaN-based compound semiconductor layer, and forming a second GaN-based compound semiconductor layer on the SiN buffer body. In this technology, it is described that dislocation in the second GaN-based compound semiconductor layer is reduced due to the existence of the SiN buffer body.

Patent Document 2 describes a manufacturing method for a group III nitride semiconductor substrate. The method includes forming an SiO$_2$ layer into a stripe form on an Si substrate and growing a group III nitride semiconductor layer. In this technology, it is described that dislocation is reduced due to lateral growth of the group III nitride semiconductor layer on the SiO$_2$ layer.

CITATION LIST

Patent Document

[Patent Document 1] Japanese Patent Application Laid-Open No. 2002-043233
[Patent Document 2] Japanese Patent Application Laid-Open No. 2000-331946

SUMMARY OF THE INVENTION

Problem to be Solved by the Invention

However, in the technique of Patent Document 1, the dislocation extends from the first GaN-based compound semiconductor layer to the second GaN-based compound semiconductor layer at a portion where the SiN buffer body is not formed. It is difficult to bend the extending dislocation so as to prevent the dislocation from reaching the surface of the second GaN-based compound semiconductor layer.

Further, in the technique of Patent Document 2, additional process is required for patterning the SiO$_2$ layer, resulting in an increase in production cost. Further, when the group III nitride semiconductor layer is grown on the stripe SiO$_2$ layer, unevenness occurs in how stress generated from a lattice constant difference and a thermal expansion coefficient difference is applied, resulting in warpage of the substrate.

The present invention has been made in view of the above problems and the object of the present invention is to provide a group III nitride semiconductor substrate manufacturing method capable of efficiently obtaining a group III nitride semiconductor substrate with a low surface dislocation density.

Means for Solving the Problem

To solve the above problems, a first aspect of the present invention is a manufacturing method for a group III nitride semiconductor substrate including: a first step of forming a second group III nitride semiconductor layer on a substrate; a second step of forming a protective layer on the second group III nitride semiconductor layer; a third step of selectively forming pits on dislocation portions of the second group III nitride semiconductor layer by gas-phase etching applied to the protective layer and the second group III nitride semiconductor layer; and a fourth step of forming a third group III nitride semiconductor layer on the second group III nitride semiconductor layer and/or the remaining protective layer so as to allow the pits to remain.

Further, to solve the above problems, a second aspect of the present invention is a manufacturing method for a group III nitride semiconductor substrate including: a first step of forming a plurality of initial nuclei made of a second group III nitride semiconductor on a substrate; a second step of eliminating some of the plurality of initial nuclei by gas-phase etching; and a third step of forming a third group III nitride semiconductor layer on the substrate and remaining ones of the plurality of initial nuclei.

Advantageous Effects of the Invention

According to the manufacturing method of the present invention, a group III nitride semiconductor substrate with a low surface dislocation density can be efficiently obtained.

DETAILED DESCRIPTION OF THE EMBODIMENTS

In the present specification, "group III nitride semiconductor" refers to a compound including group III element (Al, Ga, In, etc.) and N at a composition ratio of 1:1, and there can be exemplified AlN, GaN, InN, AlGaN, AlGaInN, and the like. As an epitaxial growing method for the group III nitride semiconductor, known methods such as an MOCVD method, an HVPE method, and an MBE method can be used. Raw material gas at the time of growth can include TMA (trimethyl aluminum) as an Al raw material, TMG (trimethylgallium) as a Ga raw material, and $NH_3$ (ammonia) as an N raw material.

(Manufacturing Method for Group III Nitride Semiconductor Substrate According to First Invention)

Hereinafter, an embodiment of a first invention will be described in detail with reference to FIGS. 1 to 4. It should be noted that each drawing is a schematic diagram wherein the dimensional ratio is not always exact, and the thickness of each layer is exaggerated with respect to the size of the substrate.

Figure 1A:
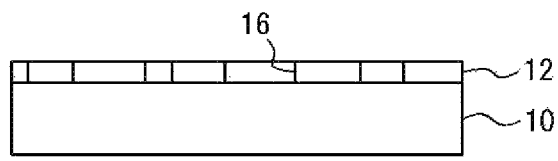
FIGS. 1A to 1E are schematic cross-sectional views illustrating each process of a manufacturing method for a group III nitride semiconductor substrate 100 according to an embodiment of the first invention.
Figure 1B:
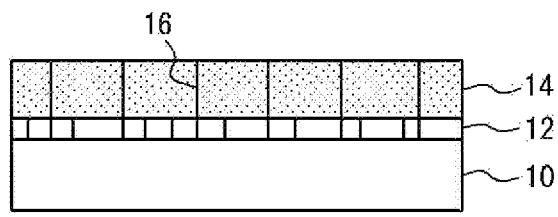
Figure 1C:
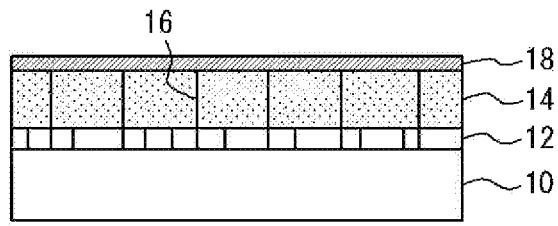
Figure 1D:
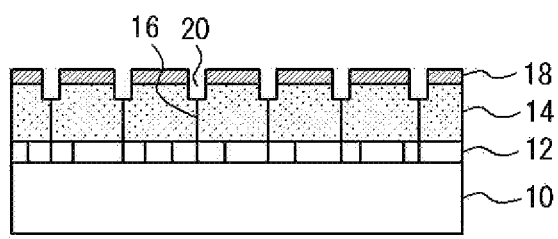
Figure 1E:
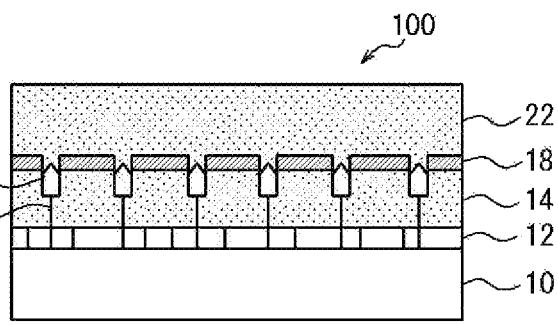
Figure 2:
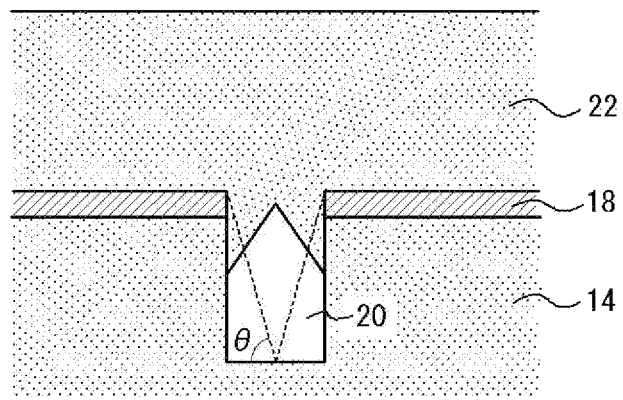
FIG. 2 is an enlarged view around the Pit 20 shown in FIG. 1.

As illustrated in FIGS. 1A to 1E, a manufacturing method for a group III nitride semiconductor substrate 100 according to the embodiment of the first invention includes a process of forming an AlN layer 12 as a first group III nitride semiconductor layer on an Si substrate 10 as a substrate (FIG. 1A); a process of forming a GaN layer 14 as a second group III nitride semiconductor layer on the AlN layer 12 (FIG. 1B, a first step); a process of forming an SiNx layer 18 as a protective layer on the GaN layer 14 (FIG. 1C, a second step); a process of selectively forming pits 20 on dislocations 16 of the GaN layer 14 by gas-phase etching applied to the protective layer 18 and GaN layer 14 (FIG. 1D, a third step), and a process of forming a GaN layer 22 as a third group III nitride semiconductor layer on the GaN layer 14 and/or remaining protective layer 18 so as to allow the pits 20 remains (FIG. 1E, a fourth step).

<Substrate>

The material of the substrate is not particularly limited and can be a sapphire substrate, a GaN substrate, $Ga_2O_3$ substrate, and the like, in addition to the Si substrate used in the present embodiment. However, the Si substrate is advantageous in terms of productivity and cost performance because of easiness of obtaining a large area substrate and inexpensiveness. The plain orientation of the Si substrate surface is not particularly limited and can be (111), (100), (110), or the like. The thickness of the substrate may be appropriately set in consideration of the warpage of each layer after epitaxial growth.

<First Group III Nitride Semiconductor Layer>

In the first invention, it is preferable to forma first group III nitride semiconductor layer on the substrate. As illustrated in FIG. 1A, in the present embodiment, the AlN layer 12 is formed on the Si substrate 10. However, when a sapphire substrate is to be used, the first group III nitride semiconductor layer need not necessarily be formed. The thickness of the first group III nitride semiconductor layer is not particularly limited; however, when the AlN layer is to be formed on the Si substrate, the thickness can be set to 20 nm to 300 nm. When the thickness is smaller than 20 nm, the surface of the Si substrate cannot be sufficiently covered, so that Si and Ga unfavorably react with each other when GaN is grown on the Si substrate. When the thickness exceeds 300 nm, a crack occurs in AlN due to a lattice constant difference between Si and AlN to expose the Si substrate, with the result that Si and Ga unfavorably react with each other. Examples of the first group III nitride semiconductor layer may include a combination of AlN and AlGaN, a combination of AlN and InGaN aside from AlN alone. When the substrate is other than the Si substrate, the first group III nitride semiconductor layer may be GaN, AlGaN, or InGaN.

<Second Group III Nitride Semiconductor Layer>

Next, the second group III nitride semiconductor layer is formed on the substrate, specifically, the first group III nitride semiconductor layer. As illustrated in FIG. 1B, in the present embodiment, the GaN layer 14 is formed on the AlN layer 12. The thickness of the second group III nitride semiconductor layer is not particularly limited and may be set to 100 nm to 2000 nm. When the thickness is too small, a hollow is not formed in the following regrowth. Further, the thickness need not be so large since it is sufficient to form the hollow, and when the thickness is too large, a crack is highly likely to occur. The second group III nitride semiconductor layer may be AlN, AlGaN, or InGaN aside from GaN.

At this time, many dislocations are generated in the AlN layer 12 due to lattice mismatch between the Si substrate 10 and the AlN layer 12, and some dislocations 16 extend into the GaN layer 14 and reach the surface thereof. Such dislocations are generated due to lattice mismatch not only between the materials used in the present embodiment, but also between a different type substrate (substrate made of a material different from the group III nitride semiconductor) and the group III nitride semiconductor. In the first invention, the following processes are performed in order to prevent the dislocations 16 from extending to the surface of the group III nitride semiconductor substrate 100 to be finally obtained.

<Protective Layer>

Next, a protective layer is formed on the second group III nitride semiconductor layer. As illustrated in FIG. 1C, in the present embodiment, the SiNx layer 18 is formed as the protective layer on the GaN layer 14. A material that is not easily etched by $H_2$ or $NH_3$ in a gas-phase etching process to be described later is acceptable as the material of the protective layer; however, SiNx or AlN is preferable as a commonly-used material capable of being grown by a MOCVD method which is most often used for growth of the group III nitride semiconductor layer. Thus, it is possible to continuously form the protective film in a single furnace without taking out the substrate from a film deposition furnace.

As a raw material gas used for growing the SiNx layer, tetramethylsilane $Si(CH_3)_4$ as an Si raw material and $NH_3$ (ammonia) as an N raw material can be used. When the SiNx layer as the protective layer is formed on the entire surface of the GaN layer 14, the third group III nitride semiconductor layer to be described later cannot be grown on the protective layer or, if can be grown, it will become polycrystalline. Thus, the SiNx layer 18 is grown discretely on the GaN layer 14. The coverage of the GaN layer by the SiNx layer is preferably 50% or more and less than 100% and, particularly preferably 50% or more and 95% or less.

When the coverage is less than 50%, an effect (dislocation selectivity at gas-phase etching to be described later) brought about by formation of the protective layer cannot be sufficiently obtained. From this viewpoint, the growth time of the SiNx layer is preferably 30 sec to 20 min, more preferably, 3 min to 10 min.

The substrate temperature at formation of the SiNx layer 18 is preferably 600° C. to 1200° C. and, particularly preferably, 900° C. to 1200° C. The furnace pressure is preferably 10 hPa to 1000 hPa. In this case, the thickness of the SiNx layer 18 is preferably set to 1 nm to 50 nm and, particularly preferably, to 1 nm to 10 nm. When the thickness is smaller than 1 nm, dislocation selectivity at etching is insufficient, and when the thickness exceeds 50 nm, many dislocations are generated in SiNx due to relaxation of SiNx.

When the AlN layer is used as the protective layer, the AlN layer is not used as the second group III nitride semiconductor layer, and the third group III nitride semiconductor layer can be grown on the protective layer, so that the AlN layer is preferably formed on the entire surface of the GaN layer 14. In this case, the thickness of the AlN layer is preferably set to 1 nm to 50 nm and, particularly preferably, to 1 nm to 20 nm. When the thickness is smaller than 1 nm, dislocation selectivity at etching is insufficient, and when the thickness exceeds 50 nm, many dislocations are generated in AlN due to relaxation of AlN. The substrate temperature at formation of the AlN layer is preferably 600° C. to 1200° C. and, particularly preferably, 900° C. to 1200° C. The furnace pressure is preferably 10 hPa to 500 hPa.

<Gas-Phase Etching>

Subsequently, gas-phase etching is performed for the protective later and second group III nitride semiconductor layer. Specifically, in the present embodiment, the gas-phase etching is applied to the SiNx layer 18 and GaN layer 14. The present inventors have found that pits can be selectively formed on dislocation portions on the second group III nitride semiconductor layer by performing the gas-phase etching under specific conditions after forming the protective layer on the second group III nitride semiconductor layer as described above. In the present embodiment, as illustrated in FIG. 1D, the pits 20 can be selectively formed on the dislocations 16 on the GaN layer 14. The thus formed pits 20 can prevent the dislocations 16 extending into the GaN layer 14 from evolving to the GaN layer 22 above the GaN layer 14.

In addition, the pits 20 are formed so as to have a large depth relative to the opening diameter thereof, so that it remains even after formation of the subsequent GaN layer 22. That is, by performing the gas-phase etching under specific conditions after formation of the protective layer on the second group III nitride semiconductor layer, an angle θ formed by a line connecting the opening end of the pits 20 and center of the bottom part thereof and the bottom part of the pits 20 can be 62° or larger. When the angle θ is smaller than 62°, GaN is layered in the pits 20 in a process of growing the GaN layer 22, and the pits are undesirably fully filled.

As a first suitable condition, the gas-phase etching is preferably performed in a gaseous mixture atmosphere including $H_2$, $NH_3$, and optionally $N_2$. Further, inert gas such as Ar may be introduced, or etching gas such as Cl-based gas may be used. However, taking in-situ etching into consideration, a typical mixture gas of $H_2$, $NH_3$, and $N_2$ used in the growth of the group III nitride semiconductor is preferably employed. Thus, it is possible to continuously form the protective film in a single furnace without the need of taking out the substrate from a film deposition furnace.

At this time, when the partial pressures of $NH_3$ and $N_2$ are high, etching hardly occurs to make the pit unlikely to be formed; while when the partial pressure of $H_2$ is high, etching occurs significantly, the surface roughness of the subsequent third group III nitride semiconductor layer becomes high, and dislocation selectivity for the pit becomes poor. Thus, it is important to control a gas flow rate ratio (gas partial pressure). Preferably, in the first suitable condition, $N_2/(H_2+NH_3)$ flow rate ratio is set to 0 to 0.5 and $NH_3/H_2$ flow rate ratio is set to 0 to 0.08 and, particularly preferably, $N_2/(H_2+NH_3)$ flow rate ratio is set to 0 to 0.2 and $NH_3/H_2$ flow rate ratio is set to 0.001 to 0.02. The etching time is preferably set to 5 sec to 10 min.

As a second suitable condition, the gas-phase etching is preferably performed in a gaseous mixture atmosphere obtained by intermittently supplying $NH_3$ to an atmosphere including $H_2$ and optionally $N_2$. In this condition, etching occurs significantly in a period (hereinafter, referred to as "$NH_3$ stop period") during which supply of $NH_3$ is stopped, while dislocation selectivity for the pit tends to be low, and the opening diameter of the pit is likely to increase. On the other hand, in a period (hereinafter, referred to as "$NH_3$ supply period") during which $NH_3$ is supplied, etching slowly progresses, while dislocation selectivity for the pit tends to be high, and the opening diameter of the pit is unlikely to increase. By repeating both the periods, it is possible to satisfy both the pit dislocation selectivity and pit depth and thereby to form the pit with high dislocation selectivity and with a suitable dimension.

Preferably, in the second suitable condition, $N_2/(H_2+NH_3)$ flow rate ratio is set to 0 to 2, $NH_3/H_2$ flow rate ratio when the $NH_3$ is supplied is set to 0.001 to 2, the $NH_3$ stop period is set to 1 sec to 20 sec, the $NH_3$ supply period is set to 1 sec to 40 sec, and the number of times of repetition of a set of both the periods is dry to 5 to 200 in order to satisfy both the pit dislocation selectivity and pit depth and, particularly preferably, $N_2/(H_2+NH_3)$ flow rate ratio is set to 0 to 0.5, $NH_3/H_2$ flow rate ratio when the $NH_3$ is supplied is set to 0 to 1, the $NH_3$ stop period is set to 1 sec to 6 sec, the $NH_3$ supply period is set to 1 sec to 15 sec, and the number of times of repetition of a set of both the periods is set to 10 to 40.

Further, the total gas flow rate is preferably made constant in both the $NH_3$ stop period and $NH_3$ supply period. To this end, in the $NH_3$ supply period, the flow rate of the $H_2$ gas is preferably made smaller than that in the $NH_3$ stop period by the amount corresponding to the gas flow rate of $NH_3$.

The substrate temperature at the gas-phase etching is preferably 900° C. to 1200° C. and, more preferably, 1000° C. to 1100° C. When the substrate temperature is lower than 900° C., an etching effect becomes low to make the pit unlikely to be formed. When the substrate temperature exceeds 1200° C., the pit dislocation selectivity may become low.

The furnace pressure at the gas-phase etching is preferably 10 hPa to 500 hPa. It is structurally difficult to set the furnace pressure to a value lower than 10 hPa. When the furnace pressure exceeds 500 hPa, GaN (1-101) is generated, so that the pit is likely to be filled at the growth of the third group III nitride semiconductor layer to make the dislocation likely to extend into the third group III nitride semiconductor layer. In the first suitable condition, the furnace pressure at the gas-phase etching is particularly preferably set to 10 hPa to 200 hPa. In the second suitable condition, the furnace pressure at the gas-phase etching is particularly preferably set to 10 hPa to 300 hPa.

In the gas-phase etching for forming the pits, more pits are preferably connected. When many pits are connected, the dislocations are associated to each other in the pit to be eliminated, so that the dislocation density of the GaN layer 22 can be reduced. In order to connect more pits, it is preferable to increase a pit formation time and the number of times of the repetition. However, when the bit formation time is too long and the repetition number is too large, all the pits are connected to eliminate selectivity. Thus, it is necessary to set the bit formation time and the repetition number so as not to allow connection of all the pits.

<Third Group III Nitride Semiconductor Layer>

Next, the third group III nitride semiconductor layer is formed on the second group III nitride semiconductor layer and/or the remaining protective layer. As illustrated in FIG. 1E, in the present embodiment, the GaN layer 22 is formed on the GaN layer 14 and/or remaining protective layer 18. At this time, the pits 20 remain. Thus, the dislocation 16 is prevented from extending into the GaN layer 22 by the pits 20. The thickness of the third group III nitride semiconductor layer is not particularly limited and is preferably set to 50 nm to 5000 nm. When the thickness is smaller than 50 nm, the surface is not sufficiently flattened. When the thickness is larger than 5000 nm, a crack may occur. The remaining pits serve as hollows not having an oxide or a nitride. The third group III nitride semiconductor layer may be AlN, AlGaN, or InGaN aside from GaN.

This process is preferably performed first under conditions wherein horizontal growth is prioritized and thereafter under conditions wherein the growth rate is prioritized. Even when the dislocation extends to the third group III nitride semiconductor layer, it can be bent in the horizontal direction under the conditions wherein the horizontal growth is prioritized to make it possible to reduce threading dislocation to the surface. Further, a portion where the pit is formed can be flattened to reduce surface roughness. Thereafter, the growth rate is prioritized to make it possible to increase productivity.

Preferably, as the conditions wherein the horizontal growth is prioritized, the furnace pressure is set to 50 hPa to 500 hPa, V/III ratio is set to 500 to 50000, substrate temperature is set to 900° C. to 1500° C., and growth time is set to 10 min to 120 min. Thereafter, as the conditions wherein the growth rate is prioritized, the furnace pressure is set to 300 hPa to 3000 hPa, V/III ratio is set to 100 to 5000, and substrate temperature is set to 900° C. to 1100° C., and the growth is continued until a target thickness is reached.

<Preferential Formation of Facet Plane>

It is also preferable that the process of forming the third group III nitride semiconductor layer (the fourth step) is performed first under conditions wherein formation of a facet plane inclined by 30° or more with respect to the growth plane is prioritized and thereafter under conditions wherein the horizontal growth is prioritized. Preferably, as the conditions wherein the formation of facet plane is prioritized, the furnace pressure is set to 50 hPa to 3000 hPa, V/III ratio is set to 10 to 10000, substrate temperature is set to 900° C. to 1500° C., and growth time is set to 1 min to 120 min. The conditions wherein the horizontal growth is prioritized are as described above, that is, preferably, the furnace pressure is set to 50 hPa to 500 hPa, V/III ratio is set to 500 to 50000, substrate temperature is set to 900° C. to 1500° C., and growth time is set to 10 min to 120 min. After the GaN layer 22 is formed under the conditions wherein the horizontal growth is prioritized, the growth is continued under the conditions wherein the growth rate is prioritized until a target thickness is reached. According to this method, the nucleus density of GaN becomes low, and thus the dislocation can be propagated laterally with respect to the growth plane.

<Ga Droplet>

In the process of forming the GaN layer 22 as the third group III nitride semiconductor layer, minute droplets of Ga are formed, and then regrowth of the initial nucleus of GaN from the Ga droplets may be promoted. When the Ga droplets are crystallized, the nucleus density of GaN becomes low, and thus the dislocation can be propagated laterally with respect to the growth plane.

A formation method for the Ga droplets includes a first method of setting the V/III ratio to a predetermined level at a low temperature and a second method of forming a GaN crystal (group III nitride) at a low V/III ratio and then removing N from the GaN crystal under an $H_2$ atmosphere.

In the first method, preferably, as a first condition for forming the Ga droplets, the substrate temperature is set to 700° C. to 1200° C., furnace pressure is set to 20 hPa to 3000 hPa, and V/III ratio is set to 0 to 10. Particularly preferably, the substrate temperature is set to 700° C. to 1100° C., furnace pressure is set to 100 hPa to 1000 hPa, and V/III ratio is set to 0 to 1.

In the second method, a first condition for forming the Ga droplets is divided into a condition for forming the GaN crystal and a condition for removing N from the GaN crystal. Preferably, as the condition for forming the GaN crystal, the substrate temperature is set to 900° C. to 1500° C., furnace pressure is set to 50 hPa to 3000 hPa, and V/III ratio is set to 10 to 50000. Particularly preferably, the substrate temperature is set to 1000° C. to 1200° C., furnace pressure is set to 500 hPa to 2000 hPa, and V/III ratio is set to 100 to 1000. Preferably, as the condition for removing N from the GaN crystal, the substrate temperature is set to 700° C. to 1200° C., furnace pressure is set to 20 hPa to 3000 hPa, $N_2/(H_2+NH_3)$ flow rate ratio is set to 0 to 4, and $NH_3/H_2$ flow rate ratio is set to 0 to 1. Particularly preferably, the substrate temperature is set to 800° C. to 1100° C., furnace pressure is set to 100 hPa to 1000 hPa, $N_2/(H_2+NH_3)$ flow rate ratio is set to 0.2 to 2, and $NH_3/H_2$ flow rate ratio is set to 0 to 0.4.

Preferably, as a second condition for crystallizing the Ga droplets formed by the first or second method, the substrate temperature is set to 900° C. to 1500° C., furnace pressure is set to 300 hPa to 3000 hPa, and V/III ratio is set to equal to or more than 500.

The method for forming the GaN layer by the Ga droplets may be applied not only to a case where the GaN layer 22 as the third group III nitride semiconductor layer is formed, but also to a case where the GaN layer 14 as the second group III nitride semiconductor layer. According to this method, the nucleus density of the GaN layer 14 becomes low, and thus the dislocation can be propagated laterally with respect to the growth plane.

<Heat Treatment for Flattening>

In the process of forming the GaN layer 14 as the second group III nitride semiconductor layer and the process of forming the GaN layer 22 as the third group III nitride semiconductor layer, it is preferable to perform heat treatment for flattening the upper surface of the GaN layer. Preferably, as conditions for the heat treatment, the substrate temperature is set to 900° C. to 1200° C., furnace pressure is set to 10 hPa to 1000 hPa, $N_2/(H_2+NH_3)$ flow rate ratio is set to 0.1 to 50, and $NH_3/H_2$ flow rate ratio is set to equal to or more than 1. Particularly preferably, the substrate temperature is set to 1000° C. to 1150° C., furnace pressure is set to 10 hPa to 500 hPa, $N_2/(H_2+NH_3)$ flow rate ratio is set to 0.5 to 5, and NH$_3$/H$_2$ flow rate ratio is set to equal to or more than 3. By performing the heat treatment under such conditions, it is possible to flatten the surface of the GaN layer without increasing the film thickness.

<Additional Protective Layer>

An SiNx layer as an additional protective layer may be formed on the SiNx layer 18 as the protective layer after selectively forming the pit 20 by the gas-phase etching at the dislocation portions on the GaN layer 14 as the second group III nitride semiconductor layer and before forming the GaN layer 22 as the third group III nitride semiconductor layer. As conditions for forming the additional SiNx layer, the substrate temperature is preferably set to 600° C. to 1200° C. and, particularly preferably, to 900° C. to 1200° C. Further, the furnace pressure is preferably set to 10 hPa to 1000 hPa. The thickness of the additional SiNx layer is preferably set to 1 nm to 10 nm. By thus performing a fifth step of forming the additional protective layer on the protective layer after the third step and before the fourth step, the nucleus density becomes low, so that it is possible to reduce the dislocation density of the third group III nitride semiconductor layer.

According to the above-described manufacturing method for the group III nitride semiconductor substrate of the present embodiment, it is possible to efficiently obtain the group III nitride semiconductor substrate 100 with a low surface dislocation density in a single furnace.

Other Embodiments

It is also preferable to repeat a set of the second and fourth steps and, optionally, third step more than once after the embodiment illustrated in FIG. 1. Thus, even when a small number of dislocations extend into the third group III nitride semiconductor layer, the extension of the dislocations can be prevented to make it possible to further reduce threading dislocation.

Figure 3:
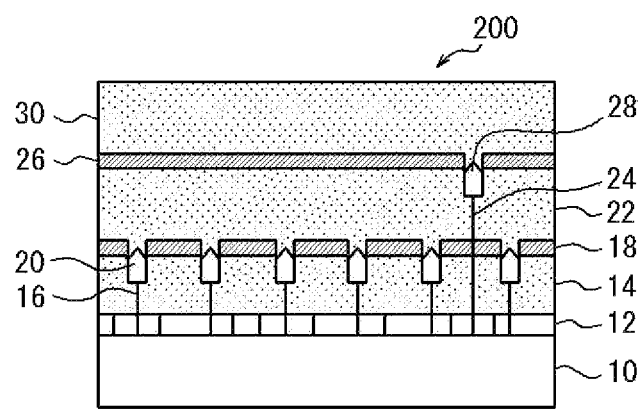
FIG. 3 is a schematic cross-sectional view illustrating a manufacturing method for a group III nitride semiconductor substrate 200 according to another embodiment of the first invention.

FIG. 3 illustrates an example in which the second, third, and fourth steps are performed once again. That is, a protective layer 26 is formed on the GaN layer 22, pits 28 are selectively formed on dislocation portions 24 of the GaN layer 22 by the gas-phase etching, and a fourth group III nitride semiconductor layer is formed on the GaN layer 22 and/or remaining protective layer 26. The protective layer and conditions for the gas-phase etching have already been described, so descriptions thereof will be omitted. Further, description of the fourth group III nitride semiconductor layer is the same as that of the third group III nitride semiconductor layer and will therefore be omitted here.

Figure 4:
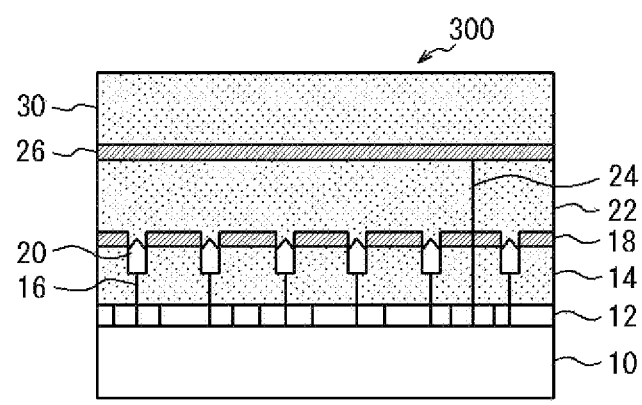
FIG. 4 is a schematic cross-sectional view illustrating a manufacturing method for a group III nitride semiconductor substrate 200 according to still another embodiment of the first invention.

FIG. 4 illustrates an example in which the second and fourth steps are performed once again. That is, the protective layer 26 is formed on the GaN layer 22, and then the fourth group III nitride semiconductor layer is formed on the GaN layer 22 and/or remaining protective layer 26. In this case, as well, threading dislocation can be reduced in proportion to the suppression of extension of the dislocation 24.

(Group III Nitride Semiconductor Substrate According to First Invention)

The group III nitride semiconductor substrates 100, 200, and 300 according to the first invention are each characterized by including the substrate 10, AlN layer 12 formed on the substrate 10 as the first group III nitride semiconductor layer, GaN layer 14 formed on the AlN layer 12 as the second group III nitride semiconductor layer, and GaN layer 22 formed on the GaN layer 14 as the third group III nitride semiconductor layer, wherein pits 20 are formed inside (surface layer part) the GaN layer 14. In the present embodiment, the dislocation 16 inside the GaN layer 14 is termi-nated by the pit 20, so that the dislocation density on the surface of the GaN layer 22 is reduced.

Further, even when there is a dislocation extending into the GaN layer 22 as the third group III nitride semiconductor layer, the dislocation can be bent by designing the growth conditions of the GaN layer 22 as described above, so that the dislocation density on the surface of the GaN layer 22 is reduced.

In the present embodiment, the density of the pits can be $1\times10^8$ cm$^2$ or higher, and the dislocation density on the surface of the GaN layer 22 as the third group III nitride semiconductor layer can be $1\times10^8$ cm$^2$ or lower.

(Manufacturing Method for Group III Nitride Semiconductor Substrate According to Second Invention)

Figure 6:
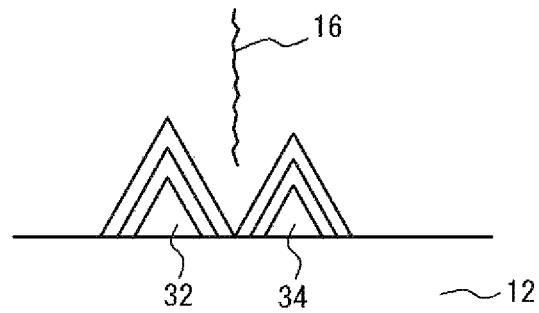
FIG. 6 is a schematic view for explaining that the dislocation 16 occurs when the adjacent initial nucleus 32 and 34 with small difference in size are associated with each other.
Figure 7:
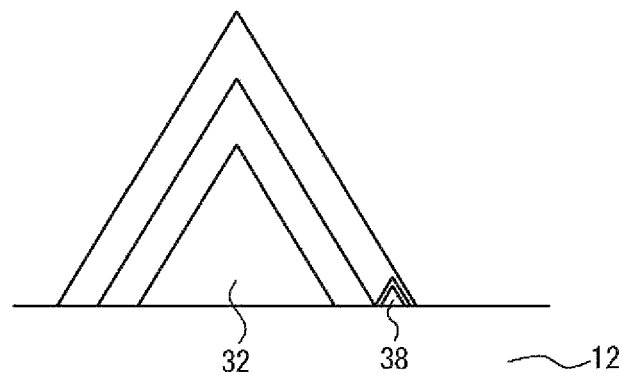
FIG. 7 is a schematic view for explaining that dislocation does not occur when the adjacent initial nucleus 32 and 38 with large difference in size are associated with each other.

Hereinafter, an embodiment of a second invention will be described in detail with reference to FIGS. 5 to 7. It should be noted that each drawing is a schematic diagram wherein the dimensional ratio is not always exact, and the thickness of each layer is exaggerated with respect to the size of the substrate.

Figure 5A:
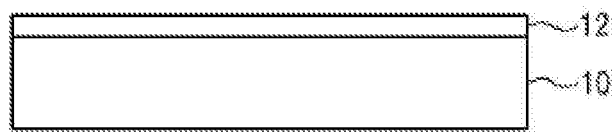
FIGS. 5A-5E are schematic cross-sectional views illustrating a manufacturing method for a group III nitride semiconductor substrate 200 according to an embodiment of the second invention.
Figure 5B:
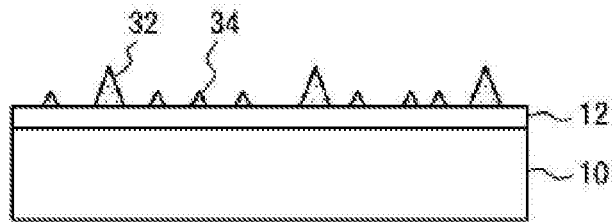
Figure 5B:
Figure 5C:
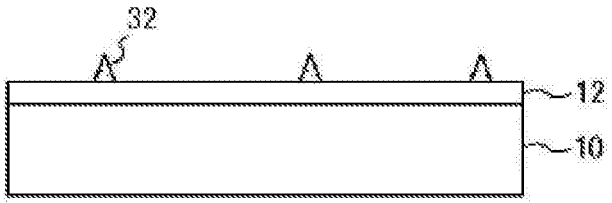
Figure 5D:
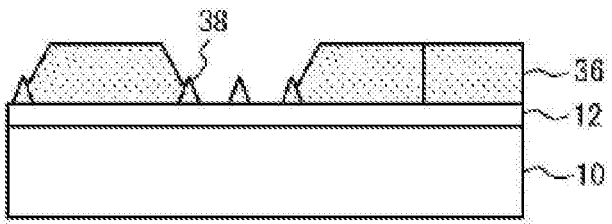
Figure 5E:
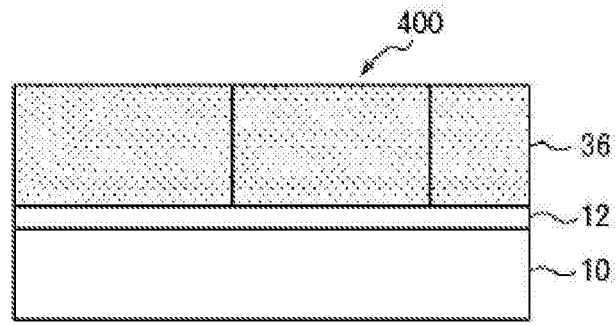

As illustrated in FIGS. 5A to 5E, a manufacturing method for a group III nitride semiconductor substrate 400 according to the embodiment of the second invention includes a process of forming an AlN layer 12 as a first group III nitride semiconductor layer on an Si substrate 10 as a substrate (FIG. 5A); a process of forming a plurality of initial nuclei 32 and 34 made of GaN as a second group III nitride semiconductor on the AlN layer 12 (FIG. 5B, a first step), a process of eliminating the initial nuclei 34 by the gas-phase etching (FIG. 5C, a second step), and a process of forming a GaN layer 36 as a third group III nitride semiconductor layer on the Si substrate 10 and remaining initial nuclei 32 (FIGS. 5D and 5E, a third step).

<Substrate>

Description of the substrate 10 is the same as that in the first invention and will be omitted here.

<First Group III Nitride Semiconductor Layer>

Description of the first group III nitride semiconductor layer 12 is the same as that in the first invention and will be omitted here. Many dislocations are generated in the AlN layer 12 due to lattice mismatch between the Si substrate 10 and the AlN layer 12. The first invention of the present application is a technique aiming to prevent the dislocations from extending to the surface of the group III nitride semiconductor substrate 400 to be finally obtained. On the other hand, the second invention to be described below is a technique aiming to suppress new dislocations that can be generated in a process of growing another group III nitride semiconductor layer on the first group III nitride semiconductor layer 12 (dislocations caused due to association between the initial nuclei that will be described later).

<Formation of Initial Nuclei>

Next, a plurality of nuclei made of the second group III nitride semiconductor is formed on the substrate or the first group III nitride semiconductor layer. As illustrated in FIG. 5B, in the present embodiment, a plurality of initial nuclei (GaN grown to an island shape) 32 and 34 as the second group III nitride semiconductor are formed on the AlN layer 12. That is, at the initial stage of growth of GaN, such an initial nucleus is formed and then grown to be the GaN layer. In the present embodiment, the growth of GaN is stopped at the stage of the initial nucleus. At this time, there is a variation in size among the initial nuclei of GaN where large-sized initial nuclei 32 and small-sized initial nuclei 34 coexist. The second group III nitride semiconductor may be AlN, AlGaN, or InGaN aside from GaN.

In the present embodiment, the maximum height of the initial nuclei is preferably set to 1 nm to 200 nm. When the maximum height is smaller than 1 nm, the variation in size among the initial nuclei is so small that effects of the second invention to be described later cannot be sufficiently obtained. When the maximum height exceeds 200 nm, a layer is undesirably formed. In this case, some initial nuclei have a diameter of 50 nm or larger, and some have a diameter of 5 nm or smaller.

<Gas-Phase Etching>

Subsequently, as illustrated in FIG. 5C, the initial nuclei 34 are eliminated by the gas-phase etching. An important point in this gas-phase etching is that the small-sized initial nuclei 34 are eliminated, but the large-sized initial nuclei 32 are made to remain although the size thereof becomes small.

Thus, thereafter, as illustrated in FIGS. 5D and 5E, generation of the dislocation in the third group III nitride semiconductor layer 36 can be suppressed during formation of the third group III nitride semiconductor layer 36. This principle will be described with reference to FIGS. 6 and 7. As illustrated in FIG. 6, the dislocation 16 is generated when the adjacent initial nuclei are associated with each other in the growing process thereof. For example, when the third group III nitride semiconductor layer 36 is formed without the gas-phase etching after the formation of the initial nuclei in FIG. 5B, many initial nuclei whose sizes are varied but relatively close to one another densely populated, so that, as illustrated in FIG. 6, the dislocation 16 is generated when the initial nuclei are associated with each other.

On the other hand, in the second invention, the third group III nitride semiconductor layer 36 is formed with the density of the initial nuclei reduced by the gas-phase etching. In this case, as illustrated in FIG. 5D, a new initial nucleus 38 is formed; however, the remaining initial nucleus 32 grows bigger, with the result that the difference in size between the remaining initial nucleus 32 and newly generated initial nucleus 38 becomes large. In this case, as illustrated in FIG. 7, the remaining large-sized initial nucleus 32 grows as if it swallowed the newly-generated initial nucleus 38, whereby the dislocation is not generated. Thus, as illustrated in FIG. 5E, the third group III nitride semiconductor layer 36 with less dislocation can be formed in the end.

As a first suitable condition, the gas-phase etching is preferably performed in a gaseous mixture atmosphere including $H_2$, $NH_3$, and optionally $N_2$. Further, inert gas such as Ar may be introduced, or etching gas such as Cl-based gas may be used. However, taking in-situ etching into consideration, a typical mixture gas of $H_2$, $NH_3$, and $N_2$ used in the growth of the group III nitride semiconductor is preferably employed. Thus, it is possible to continuously form the protective film in a single furnace without the need of taking out the substrate from a film deposition furnace.

At this time, when the partial pressures of $NH_3$ and $N_2$ are high, etching hardly occurs to make nucleus shrinking unlikely to occur; while when the partial pressure of $H_2$ is high, etching occurs significantly, the surface roughness of the subsequent third group III nitride semiconductor layer becomes high, and selectivity for the low nucleus density becomes poor. Thus, it is important to control a gas flow rate (gas partial pressure). Preferably, in the first suitable condition, $N_2/(H_2+NH_3)$ flow rate ratio is set to 0 to 0.5 and $NH_3/H_2$ flow rate ratio is set to 0.001 to 0.08. The etching time is preferably set to 5 sec to 10 min.

As a second suitable condition, the gas-phase etching is preferably performed in a gaseous mixture atmosphere obtained by intermittently supplying $NH_3$ to an atmosphere including $H_2$ and optionally $N_2$. In this condition, etching occurs significantly in a period (hereinafter, referred to as "$NH_3$ stop period") during which supply of $NH_3$ is stopped, while the nucleus selectivity tends to be low, and all the nuclei are likely to be eliminated. On the other hand, in a period (hereinafter, referred to as "$NH_3$ supply period") during which $NH_3$ is supplied, etching slowly progresses, while the nucleus selectivity tends to be high, and large nuclei are hardly eliminated. By repeating both the periods, it is possible to form the nucleus with high nucleus selectivity and with a suitable dimension.

Preferably, in the second suitable condition, $N_2/(H_2+NH_3)$ flow rate ratio is set to 0 to 2, $NH_3/H_2$ flow rate ratio when the $NH_3$ is supplied is set to 0.001 to 2, the $NH_3$ stop period is set to 1 sec to 20 sec, the $NH_3$ supply period is set to 1 sec to 15 sec, and the number of times of repetition of a set of both the periods is set to 5 to 200 in terms of the nucleus selectivity.

Further, the total gas flow rate is preferably made constant in both the $NH_3$ stop period and $NH_3$ supply period. To this end, in the $NH_3$ supply period, the flow rate of the $H_2$ gas is preferably made smaller than that in the $NH_3$ stop period by the amount corresponding to the gas flow rate of $NH_3$.

The substrate temperature at the gas-phase etching is preferably 900° C. to 1200° C. and, more preferably, 1000° C. to 1100° C. When the substrate temperature is lower than 900° C., the nucleus selectivity becomes low to make the nucleus unlikely to be etched. When the substrate temperature exceeds 1200° C., the nucleus selectivity may become low.

The furnace pressure at the gas-phase etching is preferably 50 hPa to 1000 hPa. It is structurally difficult to set the furnace pressure to a value lower than 50 hPa. When the furnace pressure exceeds 1000 hPa, it is difficult to stop growth of the third group III nitride semiconductor layer 36 while maintaining a nucleus state thereof.

<Third Group III Nitride Semiconductor Layer>

Next, the third group III nitride semiconductor layer is formed on the substrate and remaining initial nuclei of the plurality of initial nuclei. As illustrated in FIGS. 5D and 5E, in the present embodiment, the GaN layer 36 is formed on the substrate 10, AlN layer 12, and the remaining initial nuclei 32. In this process, the dislocation is suppressed from extending into the surface of the GaN layer 36 by the action described above. The thickness of the third group III nitride semiconductor layer is not particularly limited and is preferably set to 10 nm to 5000 nm. The third group III nitride semiconductor layer may be AlN, AlGaN, or InGaN aside from GaN.

This process is preferably performed first under conditions wherein horizontal growth is prioritized and thereafter under conditions wherein the growth rate is prioritized. Even when the dislocation extends to the third group III nitride semiconductor layer, it can be bent in the horizontal direction under the conditions wherein the horizontal growth is prioritized to make it possible to reduce threading dislocation to the surface. Thereafter, the growth rate is prioritized to make it possible to increase productivity. Specific conditions are the same as those in the first invention, so descriptions thereof will be omitted.

<Preferential Formation of Facet Plane>

It is also preferable that the process of forming the GaN layer 36 as the third group III nitride semiconductor layer (third step) is performed first under conditions wherein formation of a facet plane inclined by 30° or more with respect to the growth plane is prioritized and thereafter under conditions wherein the horizontal growth is prioritized. Specific conditions are the same as those in the first invention, so descriptions thereof will be omitted. According to this method, the nucleus density of GaN becomes low, and thus the dislocation can be propagated laterally with respect to the growth plane.

<Ga Droplet>

In the process of forming the GaN layer 36, droplets of Ga are formed, and then regrowth of the initial nucleus of GaN from the Ga droplets may be promoted. Specific conditions are the same as those in the first invention, so descriptions thereof will be omitted. When the Ga droplets are crystallized, the nucleus density of GaN becomes low, and thus the dislocation can be propagated laterally with respect to the growth plane.

<Heat Treatment for Flattening>

In the process of forming the GaN layer 36, it is preferable to perform heat treatment for flattening the upper surface of the GaN layer 36. Specific conditions are the same as those in the first invention, so descriptions thereof will be omitted. By performing the heat treatment under such conditions, it is possible to flatten the surface of the GaN layer without increasing the film thickness.

According to the above-described manufacturing method for the group III nitride semiconductor substrate of the present embodiment, it is possible to efficiently obtain the group III nitride semiconductor substrate 400 with a low surface dislocation density in a single furnace.

Other Embodiments

As illustrated in FIG. 5B', it is preferable to form a protective layer 35 on the substrate 10 and a plurality of initial nuclei 32 and 34 after the first step (FIG. 5B) and before the second step (FIG. 5C). By performing the gas-phase etching after the formation of the protective layer 35, it is possible to increase a probability that the small-sized initial nuclei 34 are eliminated to thereby further suppress extension of the dislocation. A material that is not easily etched by $H_2$ or $NH_3$ in the subsequent gas-phase etching process is acceptable as the material of the protective layer 35; however, SiNx or AlN is preferable as a commonly-used material capable of being grown by a MOCVD method which is most often used for the growth of the group III nitride semiconductor layer. Thus, it is possible to continuously form the protective film in a single furnace without the need of taking out the substrate from a film deposition furnace.

As a raw material gas used for growing the SiNx layer, tetramethylsilane $Si(CH_3)_4$ as an Si raw material and $NH_3$ (ammonia) as an N raw material can be used. When the SiNx layer as the protective layer is formed on the entire surface of the AlN layer 12, the third group III nitride semiconductor layer 36 cannot be grown on the protective layer or, if can be grown, it will become polycrystalline. Thus, the SiNx layer is grown discretely on the AlN layer 12. The coverage of the AlN layer by the SiNx layer is preferably 50% or more and less than 100% and, particularly preferably 50% or more and 95% or less. When the coverage is less than 50%, an effect brought about by formation of the protective layer cannot be sufficiently obtained. From this viewpoint, the growth time of the SiNx layer is preferably 30 sec to 20 min, more preferably, 3 min to 10 min.

When the AlN layer is used as the protective layer, the third group III nitride semiconductor layer can be grown on the AlN layer, so that AlN layer is preferably formed on the entire surface of the AlN layer 12. In this case, the thickness of the AlN layer is preferably set to 1 nm to 10 nm. When the thickness is smaller than 1 nm, nucleus etching selectivity is insufficient, and when the thickness exceeds 10 nm, AlN having a large thickness remains after elimination of minute nuclei, thus impairing subsequent re-film formation.

<Repetition of First Step and Second Step>

The first step (FIG. 5B) of forming the initial nucleus and the second step (FIG. 5C) of performing the gas-phase etching may be alternately repeated more than once. In this case, the number of times of repetition of a set of first and second steps is preferably set to 5 to 200. Details of the first and second steps have been already described. According to this method, the dislocation density can be further reduced.

It is also preferable to repeat a set of the first, second, and third steps more than once after the embodiment illustrated in FIG. 5. That is, the plurality of initial nuclei of GaN are formed on the GaN layer 36, then the gas-phase etching is performed to eliminate some of the plurality of initial nuclei, and then the GaN layer as the fourth group III nitride semiconductor layer is formed on the GaN layer 36 and remaining initial nuclei. This can suppress the dislocation from newly occurring in the fourth group III nitride semiconductor layer.

(Group III Nitride Semiconductor Substrate According to Second Invention)

The group III nitride semiconductor substrate 400 according to the second invention is characterized by including the substrate 10 and the group III nitride semiconductor layer 36 formed on the substrate 10, wherein the dislocation density on the surface of the group III nitride semiconductor layer 36 is $1 \times 10^8$ cm$^2$ or lower.

While the preferred embodiments of the present invention have been described above, the present invention is not limited to the above embodiments, and may be variously modified without departing from the spirit of the present invention. Accordingly, all such modifications are included in the present invention. For example, in the embodiments of the first and second inventions, the AlN layer 12 as the first group III nitride semiconductor layer is formed on the upper surface of the substrate 10; alternatively, a multilayer film obtained by alternately laminating the AlN layer and GaN layer may be provided between the substrate 10 and the AlN layer 12 for the purpose of suppressing warpage of the substrate 10. That is, the first group III nitride semiconductor layer may not be formed directly on the upper surface of the substrate. In this case, the type of the multilayer film is not particularly limited as long as the invention can be achieved.

EXAMPLES

Example 1-1

An Si substrate having a (111) surface was washed with HF and SC-1 and introduced into an MOCVD furnace. The inside of the furnace was heated up to bake the Si substrate at a temperature of 1150° C. to remove the oxide film on the Si surface. After the inside of the furnace was stabilized at 1100° C., TMA as an Al raw material and $NH_3$ as an N raw material were introduced to form an AlN layer having a thickness of 100 nm on the Si substrate. Thereafter, the supply of TMA was interrupted, and the furnace temperature was reduced to and stabilized at 1050° C. After that, TMG as a Ga raw material and $NH_3$ as an N raw material were introduced to form a GaN layer having a thickness of 1 μm on the AlN layer.

Thereafter, tetramethylsilane $Si(CH_3)_4$ as an Si raw material and $NH_3$ as an N raw material were introduced to form an SiNx layer as a protective layer on the GaN layer with the substrate temperature set to 1050° C., furnace pressure to 500 hPa, and growth time to 3 min. The thickness of the SiNx layer was 1 nm, and the coverage of the GaN layer by the SiNx layer was 80%.

Subsequently, the gas-phase etching was performed with $N_2/(H_2+NH_3)$ flow rate ratio set to 0, $NH_3/H_2$ flow rate ratio to 0.02, substrate temperature to 1050° C., furnace pressure to 100 hPa, and etching time to 10 min. As a result, a portion where connection around the dislocation was weak was preferentially etched, so that it was confirmed by TEM observation that pits were selectively formed at the dislocation portions on the GaN layer.

Thereafter, the GaN layer was re-grown with the furnace pressure set to 400 hPa, V/III ratio to 2000, substrate temperature to 1150° C., and growth time to 10 min. These conditions gave priority to the horizontal growth and, as a result, the surface where the pits were formed was flattened to some extent. Thereafter, the GaN was grown to a thickness of 1 μm with the furnace pressure set to 500 hPa, V/III ratio to 1000, and substrate temperature to 1100° C. to obtain a group III nitride semiconductor substrate.

Example 1-2

A group III nitride semiconductor substrate was obtained in the same manner as in the Example 1-1 except that the conditions for the gas-phase etching were changed. The gas-phase etching was performed in a gaseous mixture atmosphere obtained by intermittently supplying $NH_3$ to an $H_2$ atmosphere. The $N_2/(H_2+NH_3)$ flow rate ratio was set to 0, $NH_3/H_2$ flow rate ratio when supplying $NH_3$ was to 0.1, $NH_3$ stop period was to 6 sec, $NH_3$ supply period was to 10 sec, and the number of times of repetition of a set of both the $NH_3$ supply period and $NH_3$ stop period was to 40. More specifically, the set of both periods was repeated 40 times with the flow rate of $H_2$ set to 19.4 slm for 6 sec, and the flow rates of $H_2$ and $NH_3$ set to 17.6 slm and 1.8 slm, respectively, for subsequent 10 seconds. The substrate temperature was set to 1050° C., and furnace pressure was to 390 hPa.

Example 1-3

A group III nitride semiconductor substrate was obtained in the same manner as in the Example 1-2 except that the AlN layer was formed as the protective layer. The AlN layer was formed, by introducing TMA as an Al raw material and $NH_3$ as an N raw material, on the entire surface of the GaN layer with a thickness of 10 nm.

Example 1-4

A group III nitride semiconductor substrate as illustrated in FIG. 3 was obtained by performing formation of the SiNx layer, gas-phase etching, and formation of the GaN layer in the same conditions as described above after the procedure of Example 1-2.

Example 1-5

A group III nitride semiconductor substrate as illustrated in FIG. 4 was obtained by performing formation of the SiNx layer and formation of the GaN layer in the same conditions as described above after the procedure of Example 1-2.

Example 1-6

A group III nitride semiconductor substrate was obtained in the same manner as in the Example 1-1 except that the gas-phase etching for forming pits in the GaN layer, and another SiNx layer is formed as an additional protective layer on the SiNx layer as the protective layer. The formation conditions for the additional protective layer were the same as those for the protective layer, and the thickness of the additional SiNx layer was set to 1 nm.

Example 1-7

A group III nitride semiconductor substrate was obtained in the same manner as in the Example 1-1 except that the GaN layer was re-grown. The GaN layer was re-grown under a first condition wherein the V/III ratio was comparatively low and thereafter under a second condition wherein the V/III ratio was comparatively high. As the first condition, the furnace pressure was set to 500 hPa, V/III ratio was to 1000, substrate temperature was to 1150° C., and growth time was to 5 min to give priority to the formation of the facet plane of the GaN layer. As the second condition, the furnace pressure was set to 500 hPa, V/III ratio was to 4000, substrate temperature was to 1150° C., and growth time was to 5 min to give priority to the horizontal growth of the GaN layer. Thereafter, the GaN was grown to a thickness of 1 μm with the furnace pressure set to 500 hPa, V/III ratio to 1000, and substrate temperature to 1100° C. to obtain the group III nitride semiconductor substrate.

Example 1-8

A group III nitride semiconductor substrate was obtained in the same manner as in the Example 1-1 except that conditions for re-growth of the GaN layer were changed. The GaN layer was re-grown under a first condition wherein Ga droplets were formed according to a first method wherein the V/III ratio was set to a predetermined level at a low temperature and thereafter under a second condition wherein the Ga droplets were crystallized. As the first condition, the furnace pressure was set to 500 hPa, V/III ratio was to 0.5, substrate temperature was to 900° C., and growth time was to 10 min so as to form the Ga droplets. As the second condition, the furnace pressure was set to 500 hPa, V/III ratio was to 1000, substrate temperature was to 1050° C., and growth time was to 10 min so as to crystallize the Ga droplets. Thereafter, the GaN was grown to a thickness of 1 μm with the furnace pressure set to 500 hPa, V/III ratio to 1000, and substrate temperature to 1100° C. to obtain the group III nitride semiconductor substrate.

Example 1-9

A group III nitride semiconductor substrate was obtained in the same manner as in the Example 1-1 except that conditions for re-growth of the GaN layer were changed. The GaN layer was re-grown under a first condition wherein a Ga crystal was formed at a low V/III ratio, then under a second condition wherein N was removed from the GaN crystal to form Ga droplets, and thereafter under a third condition wherein the Ga droplets were crystallized. As the first condition, the furnace pressure was set to 500 hPa, V/III ratio was to 1000, substrate temperature was to 1150° C., and growth time was to 5 min so as to form the GaN crystal. As the second condition, the furnace pressure was set to 500 hPa, $N_2/(H_2+NH_3)$ flow rate ratio was to 1, and $NH_3/H_2$ flow rate ratio was to 0, substrate temperature was to 900° C., and treatment time was to 10 min so as to remove N from the GaN crystal to form the Ga droplets. As the third condition, the furnace pressure was set to 500 hPa, V/III ratio was to 1000, substrate temperature was to 1050° C., and growth time was to 10 min so as to crystallize the Ga droplets. Thereafter, the GaN was grown to a thickness of 1 μm with the furnace pressure set to 500 hPa, V/III ratio to 1000, and substrate temperature to 1100° C. to obtain the group III nitride semiconductor substrate.

Example 1-10

A group III nitride semiconductor substrate was obtained by performing heat treatment for fattening the GaN layer after the procedure of the Example 1-1. As the heat treatment conditions, the furnace pressure was set to 500 hPa, $N_2/(H_2+NH_3)$ flow rate ratio was to 1.6, $NH_3/H_2$ flow rate ratio was to 0, substrate temperature was to 1150° C., and treatment time was to 10 min.

Example 2-1

An Si substrate having a (111) surface was washed with HF and SC-1 and introduced into an MOCVD furnace. The inside of the furnace was heated up to bake the Si substrate at a temperature of 1150° C. to remove the oxide film from the Si surface. After the inside of the furnace was stabilized at 1100° C., TMA as an Al raw material and $NH_3$ as an N raw material were introduced to form an AlN layer having a thickness of 100 nm on the Si substrate.

Thereafter, the supply of TMA was interrupted, and the furnace temperature was reduced to and stabilized at 1050° C. After that, TMG as a Ga raw material and $NH_3$ as an N raw material were introduced to form many initial nuclei of GaN on the AlN layer. The furnace pressure was set to 400 hPa, V/III ratio was to 1000, and $NH_3/H_2$ flow rate ratio was to 0.8. The initial nuclei had a height of up to 50 nm and had a diameter in a range of 5 nm or less to 50 nm.

Subsequently, after the supply of TMG as a Ga raw material was stopped, and NH3 flow rate was reduced, the gas-phase etching was performed with $N_2/(H_2+NH_3)$ flow rate ratio set to 0, $NH_3/H_2$ flow rate ratio to 0.02, substrate temperature to 1050° C., furnace pressure to 390 hPa, and etching time to 10 min. As a result, small-sized initial nuclei were eliminated, while large-sized initial nuclei were made to remain although the size thereof became small.

Thereafter, the GaN layer was re-grown with the furnace pressure set to 400 hPa, V/III ratio to 2000, substrate temperature to 1150° C., and growth time to 10 min. These conditions gave priority to the horizontal growth and, as a result, GaN was grown on the remaining initial nucleus as if it swallowed the newly-generated initial nucleus.

Thereafter, the GaN was grown to a thickness of 1 μm with the furnace pressure set to 500 hPa, V/III ratio to 1000, and substrate temperature to 1100° C. to obtain a group III nitride semiconductor substrate.

Example 2-2

A group III nitride semiconductor substrate was obtained in the same manner as in the Example 2-1 except that a protective layer was formed on the initial nucleus of GaN immediately before the gas-phase etching of the Example 2-1. Tetramethylsilane $Si(CH_3)_4$ as an Si raw material and $NH_3$ as an N raw material were introduced as the protective layer to form an SiNx layer with the growth time set to 6 min. The coverage of the AlN layer by the SiNx layer was 80%.

Example 2-3

A group III nitride semiconductor substrate was obtained in the same manner as in the Example 2-2 except that the conditions for the gas-phase etching were changed. The gas-phase etching was performed in a gaseous mixture atmosphere obtained by intermittently supplying $NH_3$ to an $H_2$ atmosphere. The $N_2/(H_2+NH_3)$ flow rate ratio was set to 0, $NH_3/H_2$ flow rate ratio when supplying $NH_3$ was to 0.1, $NH_3$ stop period was to 6 sec, $NH_3$ supply period was to 10 sec, and the number of times of repetition of a set of both the $NH_3$ supply period and $NH_3$ stop period was to 40. More specifically, the set of both periods was repeated 40 times with the flow rate of $H_2$ set to 19.4 slm for 6 sec, and the flow rates of $H_2$ and $NH_3$ set to 17.6 slm and 1.8 slm, respectively, for subsequent 10 seconds. The substrate temperature was set to 1050° C., and furnace pressure was to 390 hPa.

Example 2-4

A group III nitride semiconductor substrate was obtained in the same manner as in the Example 2-3 except that the AlN layer was formed as the protective layer. The AlN layer was formed, by introducing TMA as an Al raw material and $NH_3$ as an N raw material, on the entire surface of the GaN layer with a thickness of 10 nm.

Example 2-5

The GaN layer was grown by 50 nm after the gas-phase etching of the Example 2-3 was performed, and then formation of the SiNx layer and gas-phase etching were performed once again under the same conditions. Thereafter, the GaN layer was formed to a thickness of 1 μm as in the Example 2-1 to obtain a group III nitride semiconductor substrate.

Example 2-6

A group III nitride semiconductor substrate was obtained in the same manner as in the Example 2-3 except that the initial nucleus formation process and gas-phase etching process were alternately repeated 40 times. In the initial nucleus formation process, the substrate temperature was set to 1050° C., furnace pressure was to 500 hPa, and V/III ratio was to 300. The gas-phase etching was performed in a gaseous mixture atmosphere obtained by intermittently supplying $NH_3$ to an $H_2$ atmosphere. The substrate temperature was set to 1050° C., furnace pressure was to 500 hPa, $N_2/(H_2+NH_3)$ flow rate ratio was to 0.35, $NH_3/H_2$ flow rate ratio was to 0.04, $NH_3$ stop period was to 10 sec, $NH_3$ supply period was to 30 sec, and the number of times of repetition of a set of both the $NH_3$ supply period and $NH_3$ stop period was to 20.

Comparative Example 1

Figure 8:
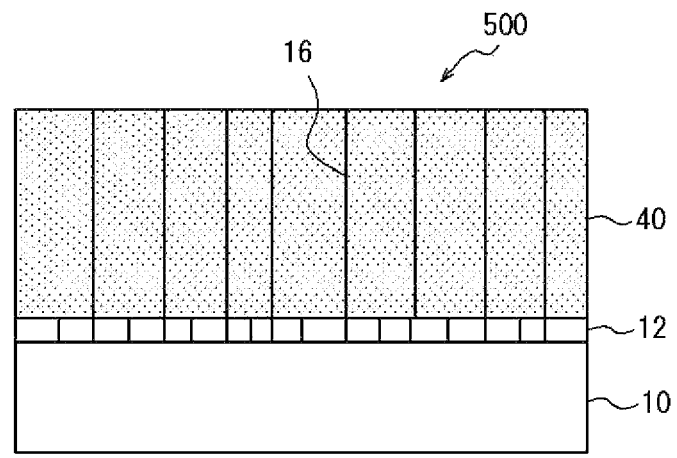
FIG. 8 is a schematic cross-sectional view illustrating a manufacturing method for a group III nitride semiconductor substrate 500 according to the comparative example 1.

An Si substrate having a (111) surface was washed with HF and SC-1 and introduced into an MOCVD furnace. The inside of the furnace was heated up to bake the Si substrate at a temperature of 1150° C. to remove the oxide film on the Si surface. After the inside of the furnace was stabilized at 1100° C., TMA as an Al raw material and $NH_3$ as an N raw material were introduced to form an AlN layer having a thickness of 100 nm on the Si substrate. Thereafter, the supply of TMA was interrupted, and the furnace temperature was reduced to and stabilized at 1050° C. After that, TMG as a Ga raw material and $NH_3$ as an N raw material were introduced to form a GaN layer having a thickness of 2 μm on the AlN layer. In this manner, a group III nitride semiconductor substrate 500 as illustrated in FIG. 8 was obtained.

Comparative Example 2

An Si substrate having a (111) surface was washed with HF and SC-1 and introduced into an MOCVD furnace. The inside of the furnace was heated up to bake the Si substrate at a temperature of 1150° C. to remove the oxide film from the Si surface. After the inside of the furnace was stabilized at 1100° C., TMA as an Al raw material and $NH_3$ as an N raw material were introduced to form an AlN layer having a thickness of 100 nm on the Si substrate. Thereafter, the supply of TMA was interrupted, and the furnace temperature was reduced to and stabilized at 1050° C. After that, TMG as a Ga raw material and $NH_3$ as an N raw material were introduced to form a GaN layer having a thickness of 1 μm on the AlN layer.

Figure 9:
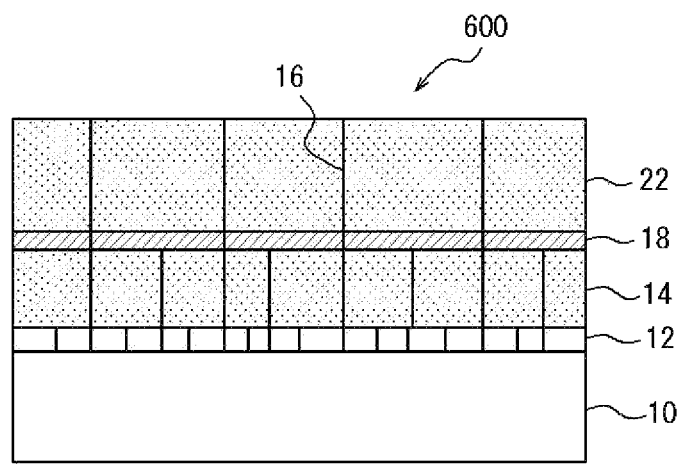
FIG. 9 is a schematic cross-sectional view illustrating a manufacturing method for a group III nitride semiconductor substrate 600 according to the comparative example 2.

Thereafter, tetramethylsilane $Si(CH_3)_4$ as an Si raw material and $NH_3$ as an N raw material were introduced to form an SiNx layer as a protective layer on the GaN layer with the growth time set to 3 min. After that, TMG as a Ga raw material and $NH_3$ as an N raw material were introduced once again to form a GaN layer having a thickness of 1 μm on the AlN layer. In this manner, a group III nitride semiconductor substrate 600 as illustrated in FIG. 9 was obtained.

<Measurement of Dislocation Density>

The dislocation densities on the surfaces of the group III nitride semiconductor substrates according to the Examples and Comparative Examples were observed and measured by cross-section TEM. Results are shown in Table 1.

TABLE 1

| | Dislocation density (/cm$^2$) |
|---|---|
| Example 1-1 | <5 × 10$^7$ |
| Example 1-2 | <5 × 10$^7$ |
| Example 1-3 | <5 × 10$^7$ |
| Example 1-4 | <1 × 10$^7$ |
| Example 1-5 | <1 × 10$^7$ |
| Example 1-6 | <1 × 10$^7$ |
| Example 1-7 | <1 × 10$^7$ |
| Example 1-8 | <1 × 10$^7$ |
| Example 1-9 | <1 × 10$^7$ |
| Example 1-10 | <1 × 10$^7$ |
| Example 2-1 | <5 × 10$^7$ |
| Example 2-2 | <5 × 10$^7$ |
| Example 2-3 | <5 × 10$^7$ |
| Example 2-4 | <5 × 10$^7$ |
| Example 2-5 | <1 × 10$^7$ |
| Example 2-6 | <1 × 10$^7$ |
| Comparative example 1 | <5 × 10$^9$ |
| Comparative example 2 | <1 × 10$^9$ |

INDUSTRIAL APPLICABILITY

According to the manufacturing method of the present invention, a group III nitride semiconductor substrate with a low surface dislocation density can be efficiently obtained.

REFERENCE SIGNS LIST

100, 200, 300, 400: Group III nitride semiconductor substrate
10: Substrate (Si substrate)
12: First group III nitride semiconductor layer (AlN layer)
14: Second group III nitride semiconductor layer (GaN layer)
16: Dislocation
18: Protective layer (SiNx layer or AlN layer)
20: Pit
22: Third group III nitride semiconductor layer (GaN layer)
24: Dislocation
26: protective layer (SiNx layer)
28: Pit
30: Fourth group III nitride semiconductor layer (GaN layer)
32: Large-sized initial nucleus (GaN: second group III nitride semiconductor)
34: Small-sized initial nucleus (GaN: second group III nitride semiconductor)
36: Third group III nitride semiconductor layer (GaN layer)
38: Newly generated initial nucleus (GaN: third group III nitride semiconductor)

What is claimed is:

1. A manufacturing method for a group III nitride semiconductor substrate, comprising:
    forming a plurality of initial nuclei made of a second group III nitride semiconductor on a substrate;
    eliminating some of the plurality of initial nuclei by gas-phase etching;
    forming a third group III nitride semiconductor layer on the substrate and remaining ones of the plurality of initial nuclei; and
    forming a protective layer on the substrate and the plurality of initial nuclei after the forming the plurality of initial nuclei made of the second group III nitride semiconductor on the substrate and before the gas-phase etching.

2. The manufacturing method as claimed in claim 1 further comprising forming a first group III nitride semiconductor layer on the substrate prior to the forming the plurality of initial nuclei made of the second group III nitride semiconductor on the substrate.

3. The manufacturing method as claimed in claim 2, wherein the first group III nitride semiconductor layer is an AlN layer.

4. The manufacturing method as claimed in claim 1, wherein the gas-phase etching is performed in a gaseous mixture atmosphere including $H_2$, $NH_3$, and optionally $N_2$.

5. The manufacturing method as claimed in claim 4, wherein the gas-phase etching is performed under conditions wherein $N_2/(H_2+NH_3)$ flow rate ratio is set to 0 to 0.5 and $NH_3/H_2$ flow rate ratio is set to 0.001 to 0.08.

6. The manufacturing method as claimed in claim 1, wherein the gas-phase etching is performed in a gaseous mixture atmosphere obtained by intermittently supplying $NH_3$ to an atmosphere including $H_2$ and optionally $N_2$.

7. The manufacturing method as claimed in claim 6, wherein the gas-phase etching is performed under conditions where $N_2/(H_2+NH_3)$ flow rate ratio is set to 0 to 2,
    $NH_3/H_2$ flow rate ratio when $NH_3$ is supplied is set to 0.001 to 2,
    $NH_3$ stop period is set to 1 sec to 20 sec,
    $NH_3$ supply period is set to 1 sec to 15 sec, and
    the number of times of repetition of a set of both the $NH_3$ stop period and $NH_3$ supply period is set to 5 to 200.

8. The manufacturing method as claimed in claim 1, wherein the forming the plurality of initial nuclei made of the second group III nitride semiconductor on the substrate and the gas-phase etching are alternately repeated more than once before the forming the third group III nitride semiconductor layer.

9. The manufacturing method as claimed in claim 8, wherein the number of times of repetition of a set of the forming the plurality of initial nuclei made of the second group III nitride semiconductor on the substrate and the gas-phase etching is 5 to 200.

10. The manufacturing method as claimed in claim 1, wherein the forming the third group III nitride semiconductor layer is performed under a first condition where group III element droplets are formed and thereafter under a second condition where the group III element droplets are crystallized.

11. The manufacturing method as claimed in claim 10, wherein the first condition is conditions where substrate temperature is set to 700° C. to 1200° C., and V/III ratio is set to 0 to 10.

12. The manufacturing method as claimed in claim 10, wherein the first condition is a condition where a group III nitride is formed, and then Nitrogen is removed from the formed group III nitride.

13. The manufacturing method as claimed in claim 10, wherein the second condition is conditions where substrate temperature is set to 900° C. to 1500° C., furnace pressure is set to 300 hPa to 3000 hPa, and V/III ratio is set to 500 or higher.

14. The manufacturing method as claimed in claim 1, wherein the forming the third group III nitride semiconductor layer includes heat treatment for flattening the upper surface of the third group III nitride semiconductor layer after formation of the third group III nitride semiconductor layer.

15. The manufacturing method as claimed in claim 14, wherein
the heat treatment for flattening the upper surface of the third group III nitride semiconductor layer is performed under conditions where substrate temperature is set to 900° C. to 1200° C.,
furnace pressure is set to 10 hPa to 1000 hPa, $N_2/(H_2+NH_3)$ flow rate ratio is set to 0.1 to 50, and
$NH_3/H_2$ flow rate ratio is set to 1 or higher.

16. The manufacturing method as claimed in claim 1, wherein the substrate is an Si substrate.

17. The manufacturing method as claimed in claim 1, wherein
the second group III nitride semiconductor is GaN, and
the third group III nitride semiconductor layer is a GaN layer.

18. The manufacturing method as claimed in claim 1, wherein the protective layer is an $SiN_x$ layer or an AlN layer.

19. The manufacturing method as claimed in claim 1, wherein substrate temperature in the gas-phase etching is set to 900° C. to 1200° C.

20. The manufacturing method as claimed in claim 1, wherein furnace pressure in the gas-phase etching is set to 50 hPa to 1000 hPa.

21. The manufacturing method as claimed in claim 1, wherein the forming the third group III nitride semiconductor layer is performed under a condition where horizontal growth is prioritized and thereafter a growth rate is prioritized.

22. The manufacturing method as claimed in claim 1, wherein the forming the third group III nitride semiconductor layer is performed under a condition where formation of a facet plane inclined by 30° or more with respect to a growth plane is prioritized and thereafter the horizontal growth is prioritized.

23. The manufacturing method as claimed in claim 1, wherein the forming the plurality of initial nuclei made of the second group III nitride semiconductor on the substrate, the forming the plurality of initial nuclei made of the second group III nitride semiconductor on the substrate and the gas-phase etching, and the forming the third group III nitride semiconductor layer are repeated more than once after the forming the third group III nitride semiconductor layer.

24. A group III nitride semiconductor substrate comprising:
a substrate;
a second group III nitride semiconductor layer formed on the substrate; and
a third group III nitride semiconductor layer formed on the second group III nitride semiconductor layer; and
a protective layer made of AlN and formed between the second group III nitride semiconductor layer and the third group III nitride semiconductor layer, wherein
pits are formed inside the second group III nitride semiconductor layer,
each of the pits forms a hollow, and
the thickness of the protective layer covering above the hollow is smaller than 20 nm.

25. The group III nitride semiconductor substrate as claimed in claim 24, wherein dislocations in the second group III nitride semiconductor layer are terminated by the pits.

26. The group III nitride semiconductor substrate as claimed in claim 24, wherein dislocations in the third group III nitride semiconductor layer is bent.

27. The group III nitride semiconductor substrate as claimed in claim 24, wherein the density of the pits is equal to or higher than $1 \times 10^8$ $cm_2$.

28. The group III nitride semiconductor substrate as claimed in claim 24, wherein the dislocation density on a surface of the third group III nitride semiconductor layer is equal to or lower than $1 \times 10^8$ $cm^2$.

29. The group III nitride semiconductor substrate as claimed in claim 24, further comprising a first group III nitride semiconductor layer between the substrate and the second group III nitride semiconductor layer.

* * * * *